United States Patent [19]

Yee et al.

[11] Patent Number: 5,736,890
[45] Date of Patent: Apr. 7, 1998

[54] METHOD AND APPARATUS FOR CONTROLLING TRANSISTORS AS RECTIFIERS

[75] Inventors: H. P. Yee, Seattle, Wash.; Hiromi Ito, Hanno, Japan; Kenji Horiguchi, Hidaka, Japan; Satoru Sawahata, Hanno, Japan

[73] Assignees: Semi Technology Design, Inc.; Shindergen Electric Mfg. Co., Ltd, Japan

[21] Appl. No.: 626,856

[22] Filed: Apr. 3, 1996

[51] Int. Cl.⁶ .................................................. H03K 17/56
[52] U.S. Cl. ................... 327/423; 327/427; 327/574; 327/583; 327/587
[58] Field of Search ................... 327/72, 73, 74, 327/75, 77, 423, 427, 574, 583, 587

[56] References Cited

U.S. PATENT DOCUMENTS

4,417,164 11/1983 Edlund ............................ 327/583
5,506,527 4/1996 Rudolph et al. ................... 327/583

Primary Examiner—Timothy P. Callahan
Assistant Examiner—Jeffrey Z. Weizig
Attorney, Agent, or Firm—Emil C. Chang; Claude A.S. Hamrick; Oppenheimer Poms Smith

[57] ABSTRACT

A rectifying device comprising of a SRMOS, an inductor, and a control circuit is disclosed. The SRMOS has a gate, a drain, and a source. The gate of the SRMOS is connected to the output of the control circuit. The inductor is connected to the drain of the SRMOS. The control circuit uses two sense traces for determining the voltage (or current) passing between the inductor (that is connected to the drain) and the source of the SRMOS. Upon sensing a forward characteristic (voltage or current), the SRMOS forward biases to allow current to flow through the SRMOS. Upon sensing a reverse characteristic (voltage or current), the SRMOS reverse biases to cut off any current flow. Hysteresis is used in setting the forward biasing threshold voltage and the reverse biasing threshold voltage for the SRMOS. In reverse biasing and forward biasing the SRMOS, $V_{gs}$ is stepped (or curved) controlled to avoid false turn ON/OFF of the SRMOS.

30 Claims, 9 Drawing Sheets

METHOD AND APPARATUS FOR CONTROLLING TRANSISTORS AS RECTIFIERS

BACKGROUND OF THE INVENTION

1. Field of the Invention

The present invention generally relates to methods and circuits for operating MOSFET devices as rectifying devices and more particularly, to a circuit for controlling a MOSFET device to operate like a diode.

2. Description of the Prior Art

In the field of power conversion, MOSFET devices are increasingly used as rectifying devices due to the low drain voltage (forward voltage) property of the MOSFET devices during the forward biasing (or ON) state. For example, a conventional diode would have about a 0.7 V forward voltage drop. For low voltage applications where the supply voltage is 3.3 volts, a 0.7 V drop becomes significant. A MOSFET device operated as a rectifying device typically would have less than a 0.2 V forward voltage drop (depending on the current). It is thus more efficient and is the preferred device for low voltage power conversion applications.

Figure 1A:
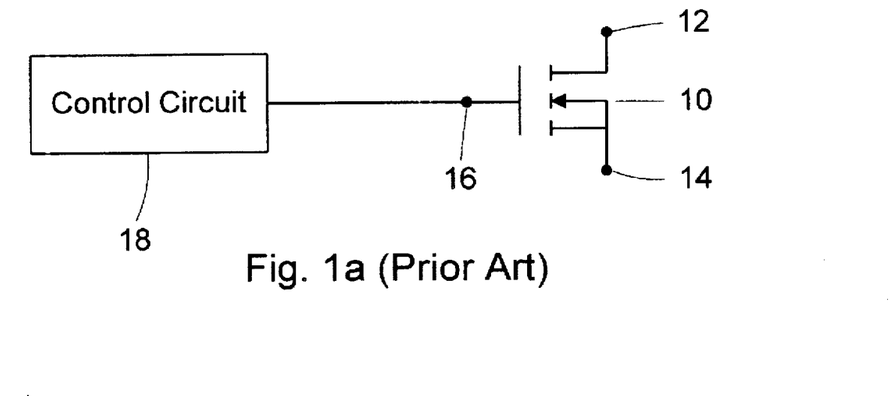
FIG. 1a illustrates a SRMOS operated by a control circuit.

A MOSFET device used as a rectifying device is often referred to as a synchronous rectifying MOSFET (SRMOS) device. Referring to FIG. 1a, SRMOS, like a MOSFET, is a three-terminal device 10 having a source terminal 14, a drain terminal 12, and a gate terminal 16. Although an NMOS is used for illustration herein, SRMOS devices and the invention disclosed herein are not limited to NMOS MOSFETs. Typically, the SRMOS device is operated by a control circuit 18.

The voltage ($V_{gs}$) at the control (gate) terminal controls the resistance (RON) between the two conduction terminals, the drain terminal and the source terminal. When RON is substantially large, the SRMOS is considered to be in the reverse bias (OFF) state. When RON is substantially small, the SRMOS is considered to be in the forward bias (ON) state. The exact RON which defines the ON and OFF state of a SRMOS is application dependent.

The threshold voltage ($V_{th}$) is the $V_{gs}$ voltage of the SRMOS at which the SRMOS is at the boundary between the ON and OFF states. In most applications, $V_{gs}$ is set well above $V_{th}$ if the SRMOS ON state is desired, and $V_{gs}$ is set at zero or less than zero if the SRMOS OFF state is desired.

In order for a SRMOS device to behave like a diode, the $V_{gs}$ voltage of the SRMOS must be well above the $V_{th}$ voltage when the $V_{ds}$ voltage is negative (SRMOS ON state), and the $V_{gs}$ voltage of the SRMOS device must be well below the $V_{th}$ voltage when the $V_{ds}$ voltage is positive (SRMOS OFF state). This control method is called synchronization. During the SRMOS ON state, $I_{ds}$ (drain-source current) is in the direction of source to drain and is referred to as the forward current. During the SRMOS OFF state, ideally there should be no $I_{ds}$. In practice, there is a small amount of reverse current (in the direction of drain to source) and it should be kept at a minimum.

Figure 1B:
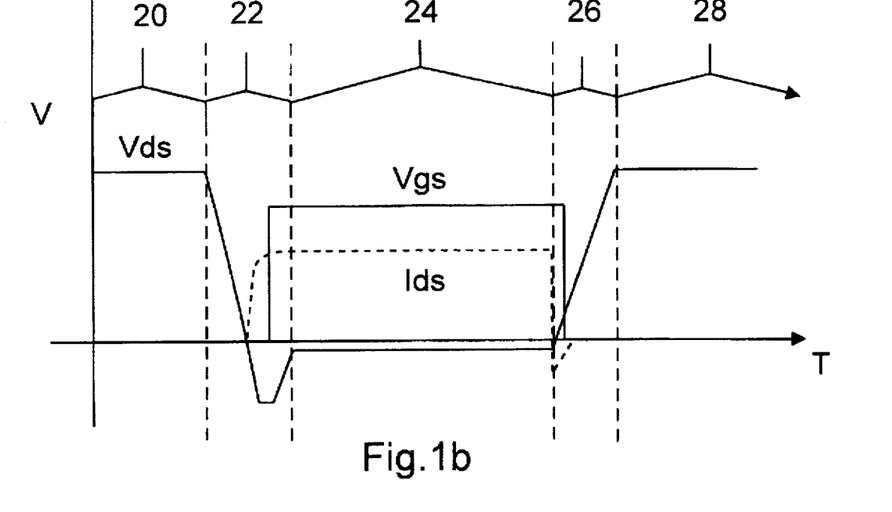
FIG. 1b shows the ideal $V_{gs}$ and $I_{ds}$ voltage waveform characteristics for a given $V_{ds}$ waveform.

Referring to FIG. 1b, the ideal $V_{gs}$ and $I_{ds}$ waveforms with respect to the $V_{ds}$ waveform is illustrated. When $V_{ds}$ is high (SRMOS is OFF) as is shown in time period 20, $V_{gs}$ is low and $I_{ds}$ is at zero or near zero. During the transition as is illustrated in time period 22, $V_{ds}$ drops below the zero-crossing, dips into the negative region, and raises up to near zero volt (the dip is due to body diode conduction). At about the same time, $I_{ds}$ (as shown by the dashed line) ramps up, and $V_{gs}$ goes high. In time period 24, $V_{ds}$ remains negative, $V_{gs}$ remains high, and $I_{ds}$ is at a fairly constant level. In time period 26, $V_{ds}$ raises above the zero-crossing, $V_{gs}$ turns OFF, and $I_{ds}$ reduces to Zero or near zero. Then, $V_{ds}$ returns to high which again is the SRMOS OFF state.

Current SRMOS control circuitries are known to be problematic in that they generate false turn-ON signals, and they are fairly complicated. Moreover, SRMOS and their control circuitries are generally designed and custom tailored for specific applications. There is a lack of SRMOS and control circuits for general application as rectifiers.

Figure 2A:
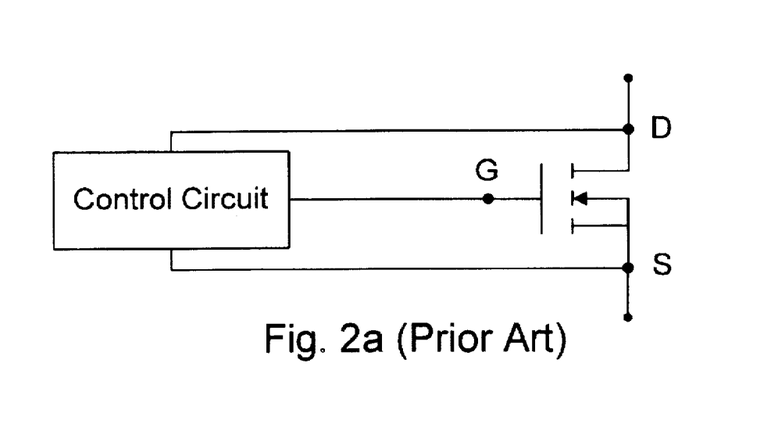
FIG. 2a shows a prior art circuit where the control circuit senses the voltage (or current) across the SRMOS.

In a prior art reference, a Japanese patent application, No. Heisei 4-242955, provides a circuitry, referring to FIG. 2a, for achieving synchronization by sensing the $V_{ds}$ voltage between the drain and source terminals and controlling the $V_{gs}$ voltage accordingly. Ideally, referring to FIG. 1b, after the $V_{ds}$ voltage drops below zero volt, the control circuitry senses such drop and generates the necessary $V_{gs}$ voltage to turn the SRMOS ON. When $V_{ds}$ raises above the zero-crossing, $V_{gs}$ is turned OFF. In practice, the disclosed method has very serious practical problems barring effective implementation of such method.

Figure 2B:
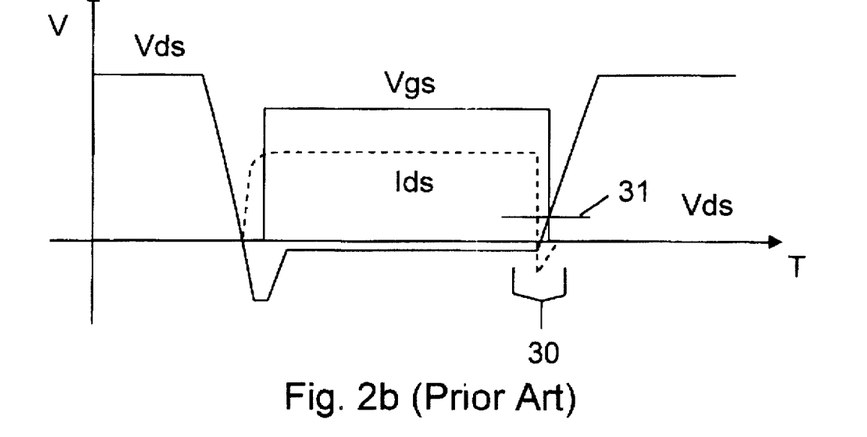
FIG. 2b shows the $I_{ds}$ waveform with reverse conduction as generated by prior art circuits.

Specifically, one problem occurs when the SRMOS switches from the ON state to the OFF state using a positive threshold level. In this method, referring to FIG. 2b, after $V_{ds}$ goes from a negative level to a positive level and when it is slightly positive, $V_{gs}$ is reduced from well above $V_{th}$ to zero volts. However, during the ON state of the SRMOS, $V_{gs}$ is well above $V_{th}$ (a small RON), and $V_{ds}$ is not sensitive to $I_{ds}$. When turning OFF the SRMOS, due to the small RON value, substantial reverse $I_{ds}$ is required before $V_{ds}$ becomes sufficiently positive to reach the positive threshold level 31 to trigger a discharge of $V_{gs}$, resulting in reverse conduction 30 and an unacceptable delay in turning the SRMOS OFF.

Figure 2C:
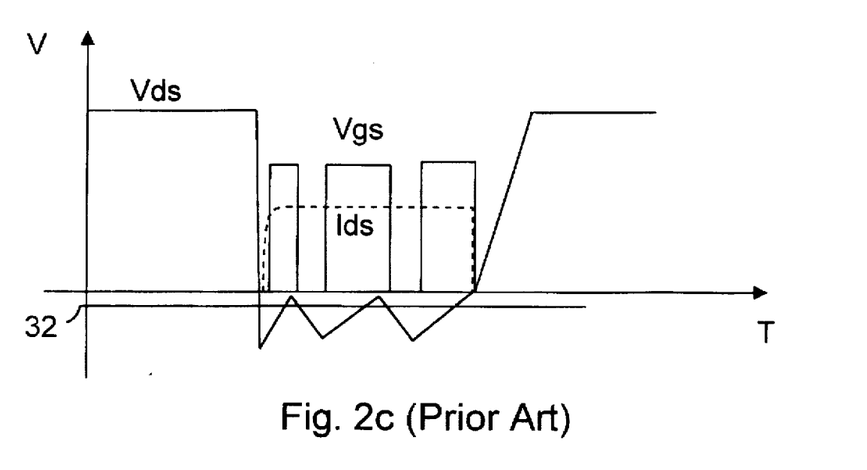
FIG. 2c illustrates the false turn-ON and false turn-OFF conditions as generated by prior art circuits.

Another problem is that if a slightly negative $V_{ds}$ voltage level is used as a threshold level for turning OFF the SRMOS (as opposed to sensing for a slightly positive $V_{ds}$ voltage level), the SRMOS can become unstable due to a fluctuating $V_{ds}$ voltage. More specifically, referring to FIG. 2c, a fluctuating $V_{ds}$ voltage reaching the threshold voltage level (32) will cause the control circuitry to discharge $V_{gs}$. However, if $V_{ds}$ drops back below the threshold level 32, $V_{gs}$ is charged again to turn ON the SRMOS. The result is then a $V_{gs}$ voltage fluctuating between the ON and OFF states, erroneously turning the SRMOS ON and OFF.

A similar method is disclosed in a U.S. patent application, Ser. No. 08/040,920, for static SRMOS operation. Static SRMOS operation is a special mode of MOSFET operation where $V_{gs}$ is slightly below $V_{th}$ but above zero. In this mode, the MOSFET can carry a relatively small forward current (source to drain) but no reverse current (drain to source). The problem with the disclosed method is that in practice it is very difficult to implement, rending it unsuitable for practical applications. Additionally, the disclosed method suffers from the reverse conduction problem and the false turn-ON/OFF conditions described above.

SUMMARY OF THE INVENTION

It is therefore an object of the present invention to provide a rectifying method and apparatus utilizing a SRMOS that minimizes false turn-ON and turn-OFF conditions.

It is another object of the present invention to provide a rectifying method and apparatus utilizing a SRMOS that minimizes the reverse conduction condition when the rectifying device is turning OFF.

It is yet another object of the present invention to provide a rectifying method and apparatus utilizing a SRMOS that is generally applicable for a variety of applications.

It is yet another object of the present invention to provide a rectifying method and apparatus utilizing a SRMOS that is simple in design.

Briefly, the preferred embodiment of the present invention is comprised of a SRMOS, an inductor, and a control circuit. The SRMOS has a gate, a drain, and a source. The gate of the SRMOS is connected to the output of the control circuit. The inductor is connected to the drain of the SRMOS. The control circuit uses two sense traces for determining the voltage (or current) passing between the inductor (that is connected to the drain) and the source of the SRMOS. Upon sensing a forward characteristic (voltage or current), the SRMOS forward biases to allow current to flow through the SRMOS. Upon sensing a reverse characteristic (voltage or current), the SRMOS reverse biases to cut off any current flow. Hysteresis is used in setting the forward biasing threshold voltage and the reverse biasing threshold voltage for the SRMOS. In reverse biasing and forward biasing the SRMOS, $V_{gs}$ is stepped (or curved) controlled to avoid false turn ON/OFF of the SRMOS.

The present invention is not limited to the power conversion field and is equally applicable to both NMOS, PMOS, or other types of transistors.

An advantage of the present invention is that it provides a rectifying method and apparatus utilizing a SRMOS that minimize false turn-ON and turn-OFF conditions.

Another advantage of the present invention is that it minimizes the reverse conduction condition when the rectifying device is turning OFF.

Yet another advantage of the present invention is that it is generally applicable for a variety of applications.

Yet another advantage of the present invention is that it is simple in design.

These and other objects and advantages of the present invention will no doubt become apparent to those skilled in the art after having read the following detailed description of the preferred embodiment which is illustrated in the several figures of the drawing.

DETAILED DESCRIPTION OF THE PREFERRED EMBODIMENTS

Figure 3A:
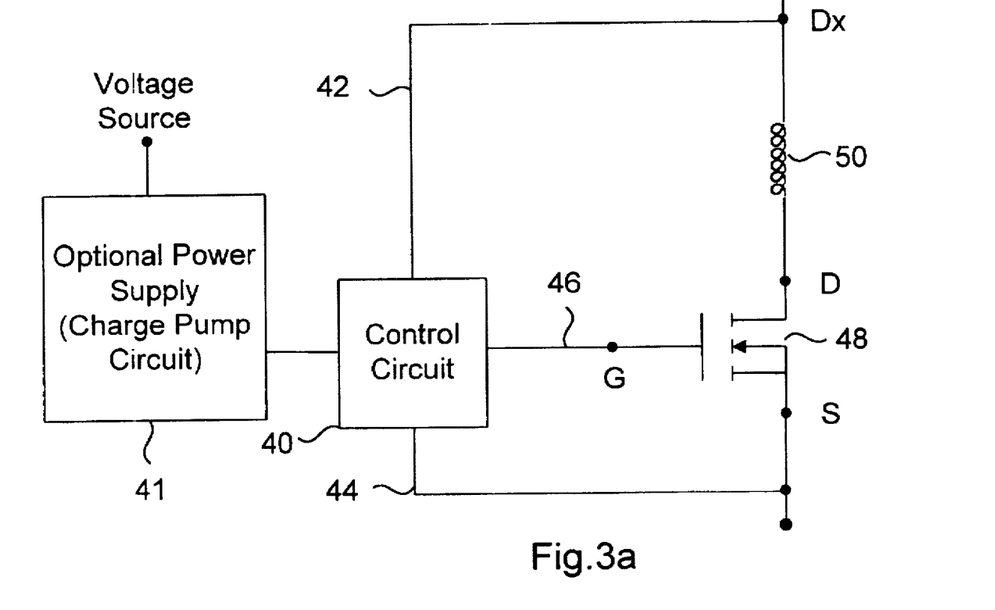
FIG. 3a illustrates the preferred embodiment of the present invention.

Referring to FIG. 3a, the preferred embodiment of the present invention is illustrated. A control circuit 40, having two sense traces, 42 and 44, and an output trace 46, is connected to the gate terminal of a SRMOS 48 via the output trace 46. The drain terminal of the SRMOS 48 is connected to an inductor 50. The control circuit senses the voltage level between the inductor at point Dx and the source terminal by using the two sense traces, 42 and 44. Although the two sense traces sense voltage levels, the preferred embodiment can be readily modified to sense current levels without compromising the invention disclosed herein. An optional power supply (charge pump circuit) 41 may be connected to the control circuit 40 to supply the needed voltage for the control circuit 40 and the SRMOS.

Figure 3B:
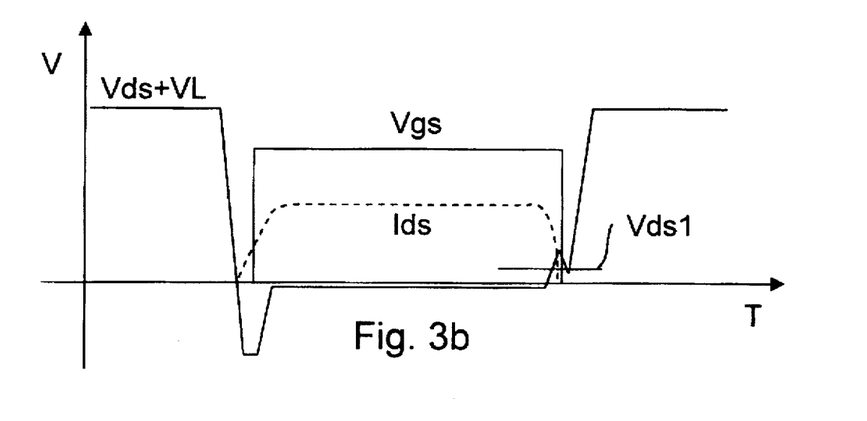
FIG. 3b illustrates the $V_{ds}$ waveform with the spike voltage triggering an earlier turn-OFF.

The inductor 50 provides a calculated amount of voltage, $V_L$. During the transition when $V_{ds}$ crosses from the negative voltage region to the positive voltage region, the change in $I_{ds}$ going through the inductor ($\Delta I_{ds}/\Delta t$) causes a small voltage spike, $V_L$. Referring to FIG. 3b, when the voltage spike $V_L$ is summed with $V_{ds}$, the summed total voltage ($V_{ds}+V_L$) 52 is sensed by the control circuit. When the control circuit determines that the $V_{ds}+V_L$ voltage is greater than a preset voltage level, $V_{ds1}$, and $V_{gs}$ is discharged. Thus, the voltage spike, $V_L$, causes the SRMOS be turned OFF slightly earlier in time, and the large, undesirable reverse conduction condition of the prior art is avoided.

Figure 3C:
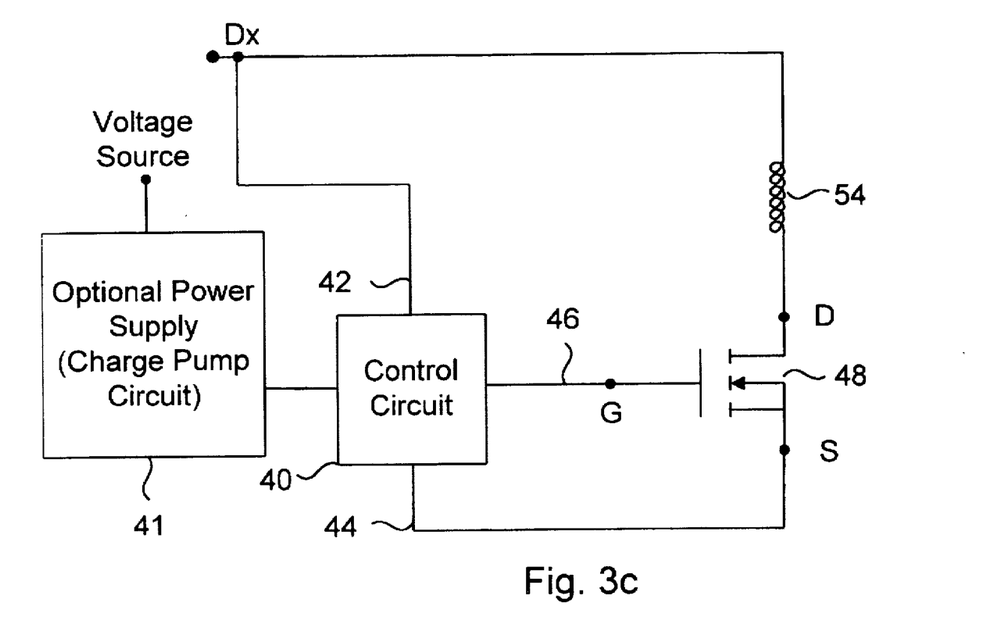
FIG. 3c illustrates an alternate embodiment of the present invention.

Since only a small amount of inductance is needed, depending on the specific application and processing of the SRMOS device, the amount of inductance can be obtained from the inductance inherent in the trace itself. Referring to FIG. 3c, by placing the sensing point at Dx at a calculated distance away from the drain terminal, the inherent internal inductance (54) as provided by the trace between points D and Dx supplies the needed $V_L$ voltage spike during the $V_{ds}$ transition. Inductance available in a bonding wire or a packaging lead can be used as well.

Figure 4:
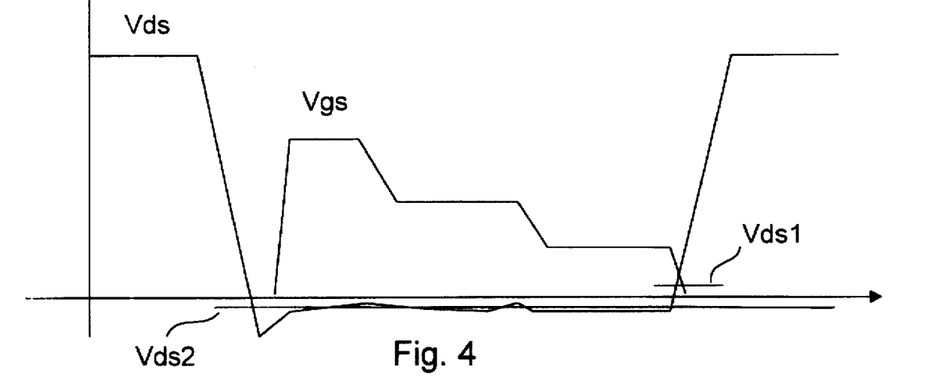
FIG. 4 shows the stepped $V_{gs}$ waveform characteristics as generated by the control circuit of the preferred embodiment.

In order to provide for the case where $V_{ds}$ changes slowly over time or fluctuates back and forth at the turn-OFF threshold level causing false turn-ON/OFF conditions, the control circuit of the present invention uses two threshold voltage levels, $V_{ds1}$ and $V_{ds2}$, and is designed to generate stepped (or curved) $V_{gs}$ voltage levels in turning OFF the SRMOS. Referring to FIG. 4, when $V_{ds}$ reaches $V_{ds2}$, the control circuit reduces $V_{gs}$ stepwise. As $V_{ds}$ reaches the $V_{ds1}$ threshold level, $V_{gs}$ can be completely discharged. If $V_{ds}$ crosses the $V_{ds2}$ threshold level and then drops below that level, $V_{gs}$ would not have been complete discharged and the SRMOS remains ON.

Figure 5:
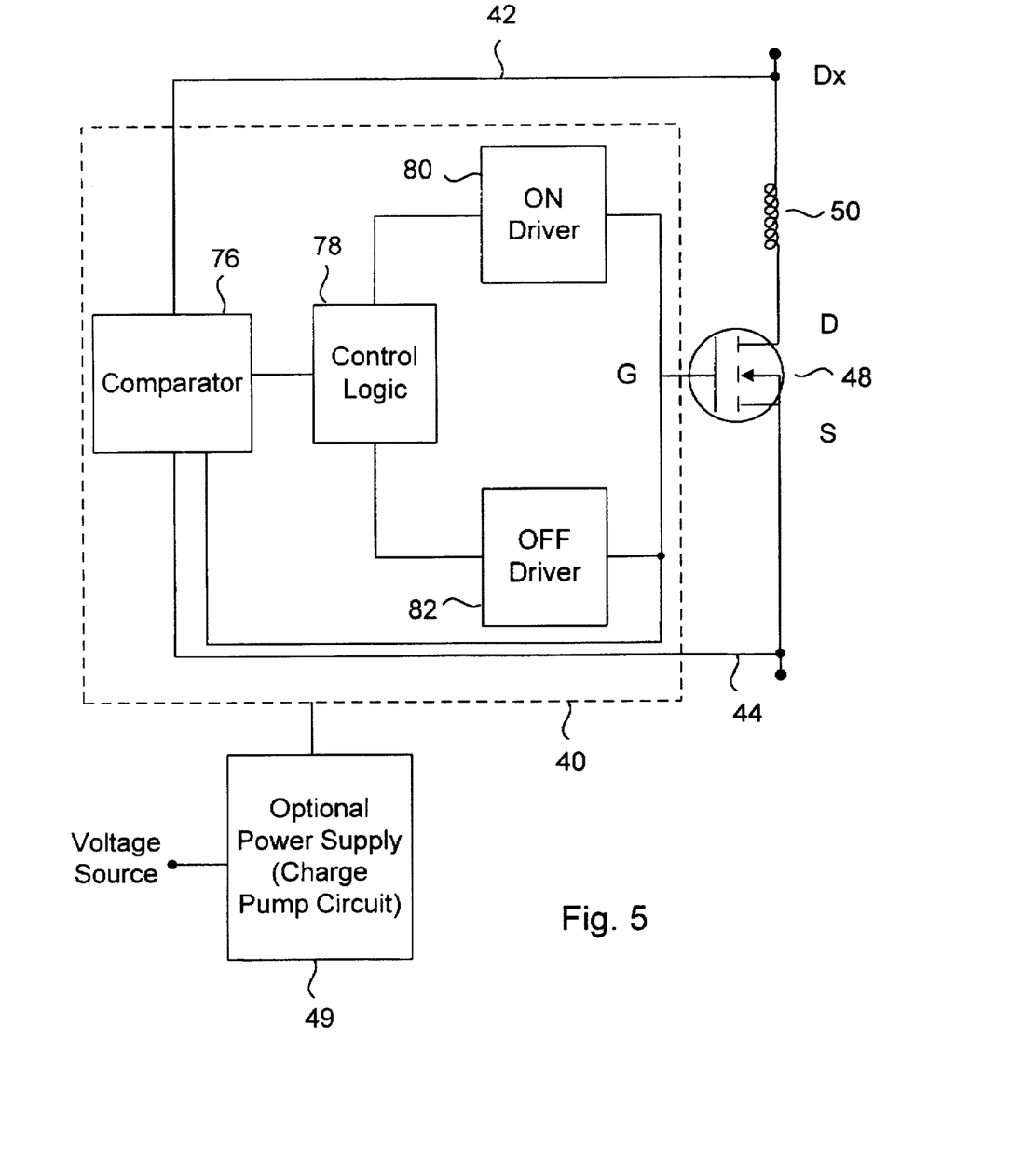
FIG. 5 illustrates a general block diagram of the control circuit.

Having described the desired voltage and current characteristics as provided by the present invention, the control circuit of the preferred embodiment is now described. Referring to FIG. 5, the control circuit 40 extends two sense traces, 42 and 44, to two sides of the SRMOS 48. On one side of the SRMOS 48, sense trace 44 is connected to the source terminal of the SRMOS. On the other side of the SRMOS, sense trace 42 is connected at point Dx, next to inductor 50 that is connected in series with the drain terminal of the SRMOS. An optional power supply (charge pump circuit) 41 may be connected to the control circuit 40 to supply the needed voltage for the control circuit 40 and the SRMOS.

The control circuit 40 is generally comprised of a comparator block 76, a control logic block 78 which controls the ON Driver block 80 and the OFF Driver block 82 in operating the SRMOS. When the ON Driver block 80 is turned on (OFF Driver block 82 is turned off), $V_{gs}$ goes high and the SRMOS is turned ON to rectify the voltage. When the OFF Driver block 82 is turned on (ON Driver block 80 is turned off), $V_{gs}$ is discharged, and the SRMOS is turned OFF.

Figure 6:
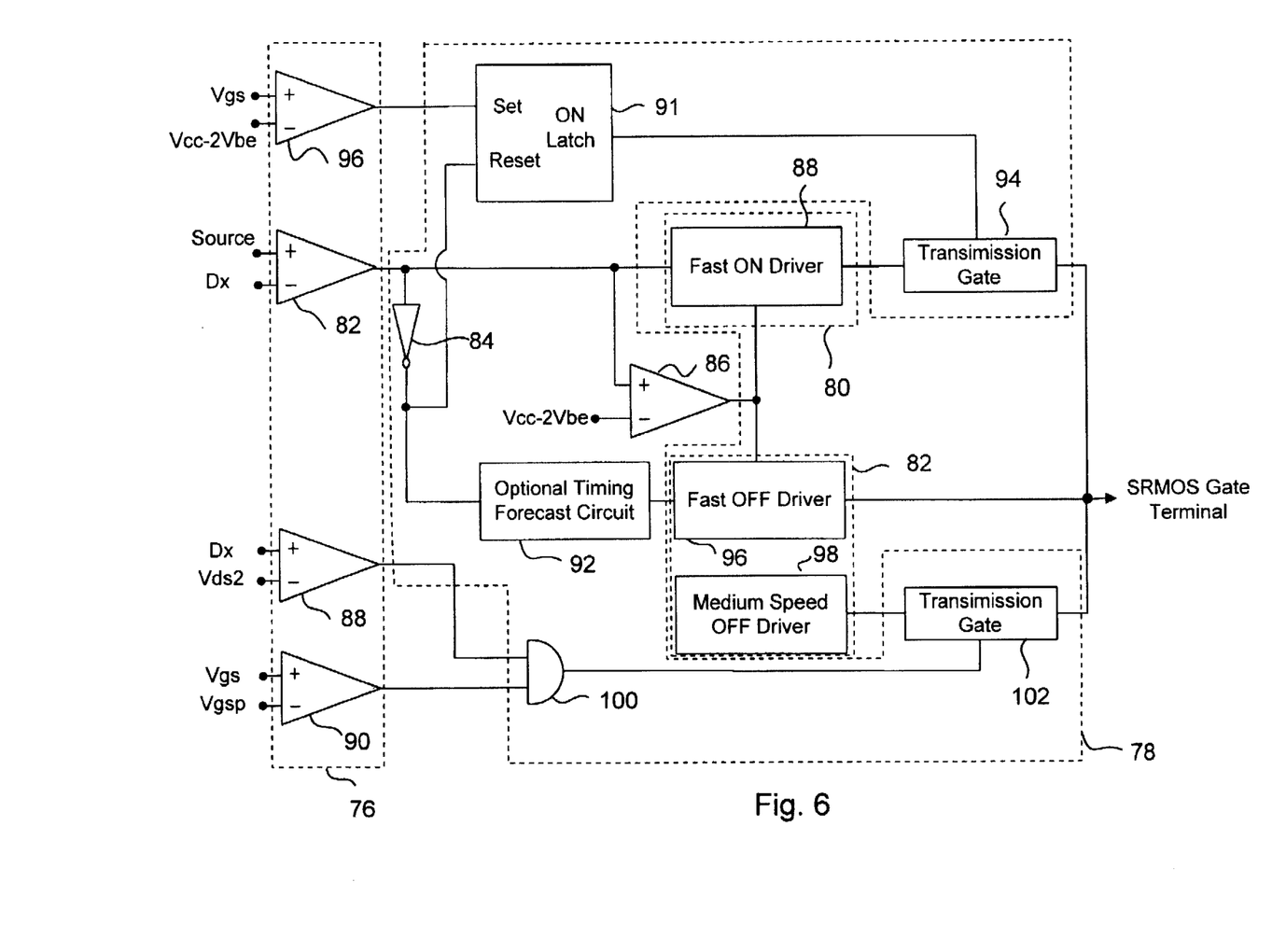
FIG. 6 shows the preferred embodiment of the control circuit.

Referring to FIG. 6, the preferred embodiment of the control circuit is illustrated. The main comparator 82 drives an inverter 84, a cascade comparator 86, and a Fast On Driver 88. It compares the voltage at point Dx and the voltage at the source terminal. When the Dx voltage is less than the source voltage, the main comparator generates a high output signal.

The inverter 84 is connected to the Reset terminal of a flip-flop 91 and an optional Timing Circuit 92. The purpose of the flip-flop is to control the transmission gate 94 between the Fast On Driver 88 and the SRMOS gate terminal. The Reset terminal of the flip-flop 91 is low when the main comparator 82 is high, generating a high signal at the On Latch terminal. A high signal from the flip-flop causes the transmission gate 94 to close. In effect, when the main comparator 82 generates a high signal, the Fast On Driver 88 is activated and the transmission gate 94 closes to allow charging of the SRMOS gate.

The Set terminal of the flip-flop is connected to the output of comparator 96 which goes high when $V_{gs}$ is greater than $V_{cc}-2V_{be}$, $V_{cc}$ being the supply voltage, $V_{be}$ being about one diode drop (0.7 V), and $V_{cc}-2V_{be}$ being the level for stop charging of the SRMOS gate terminal. When the voltage from comparator 96 is low, the On-Latch terminal is low. Upon receiving the low signal, transmission gate 94 opens and disconnects the SRMOS gate from the Fast On Driver 88. Thus, when $V_{gs}$ is greater than $V_{cc}-2V_{be}$, $V_{gs}$ has been charged to a sufficiently high level for turning ON the SRMOS, and the charging stops.

Figure 7:
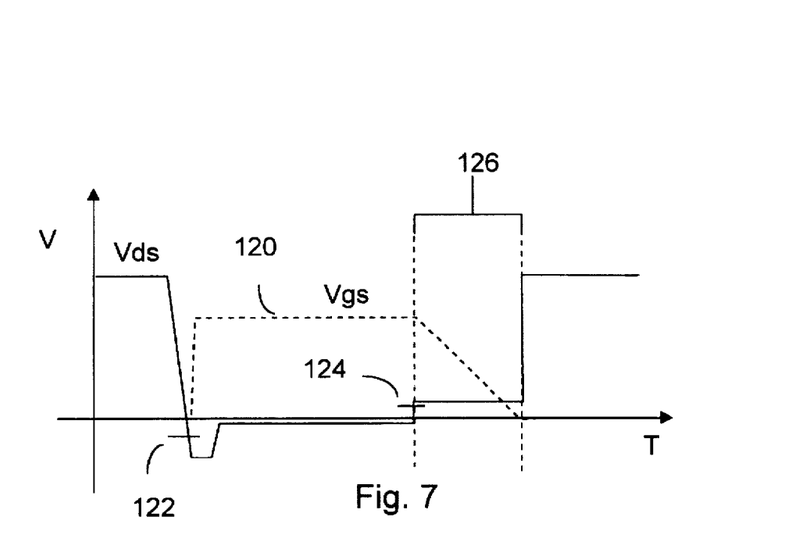
FIG. 7 illustrates the slow transition characteristics of a single comparator causing the Non-Decisive state.

The main comparator 82 drives the cascade comparator 86. The cascade comparator 86 is provided to prevent the cross conduction condition which otherwise might occur during the Non-Decisive state. Referring to FIG. 7, $V_{ds}$ is illustrated in contrast with the comparator output signal (as indicated by the dashed line 120). The comparator turns on at a preset threshold level 122, and turns off at another preset threshold level 124. However, a single comparator (such as the main comparator) may exhibit a slow transition period 126 from ON to OFF. This period is referred to as the Non-Decisive state where cross conduction may occur, cross conduction being the undesirable condition where both the Fast On Driver and the Fast Off Driver may be on. In order to prevent the cross conduction condition from happening, referring back to FIG. 6, the cascade comparator 86 is provided.

The cascade comparator 86 compares a reference voltage, $V_{cc}-2V_{be}$, with the voltage from the main comparator 82. The cascade comparator 86 is selected to provide a very sharp transition. When the voltage from the main comparator 82 exceeds that of the reference voltage, the cascade comparator is turned on and the Fast On Driver 88 is thereby turned on. The reference voltage is set at a level where transition of the main comparator is almost completed. If the cascade comparator generates a low signal (off), the Fast On Driver 88 is turned off and the Fast Off Driver 96 is turned on. If the cascade comparator generates a high signal (on), the Fast On Driver 88 is turned on and the Fast Off Driver 96 is turned off.

Inverter 84 also drives an optional Timing Circuit 92 that is connected to the Fast Off Driver 96. If the optional Timing Circuit is not used, inverter 84 is connected directly to the Fast Off Driver 96. The output of the Fast Off driver 96 is connected to the SRMOS gate terminal to discharge $V_{gs}$ when it is turned on.

The Medium Speed Off Driver 98 may be used to discharge the gate voltage if transmission gate 102 is closed, and the transmission gate 102 is closed if both comparators 88 and 90 generate high signals. Comparator 88 is a comparator going high when the voltage level at point Dx (FIG. 5) is greater than a reference threshold voltage level, $V_{ds2}$. Comparator 90 compares the gate voltage, $V_{gs}$, with a gate reference voltage, $V_{gsp}$, and goes high when $V_{gs}$ is greater than $V_{gsp}$. $V_{gsp}$ is a gate reference voltage indicating the gate voltage level where the Medium Off Driver is to be turned off. The Medium Speed Driver 98 provides a stepped discharge of $V_{gs}$ as is illustrated in FIG. 4. Note that a gradual curved discharge of $V_{gs}$ is within the scope of the present invention as well.

The optional Timing Forecast Circuit 92 is provided for the situation where the duty ratio (ON time over Period) only change slightly from cycle to cycle, as is the case for some power converter designs. The control circuit of the SRMOS can take advantage of this situation by turning OFF the SRMOS just before the actual turn off signal from the power converter itself, thus forecasting the SRMOS turn off time.

Figure 8A:
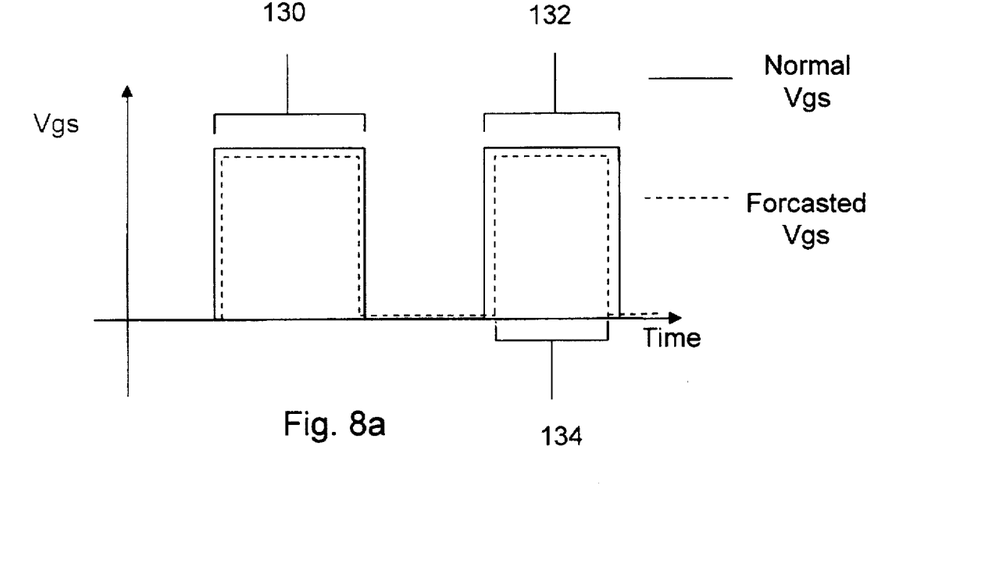
FIG. 8a shows the two duty cycles of the normal $V_{gs}$ and the forecasted $V_{gs}$.

Many different implementation of the timing forecast circuit can be designed. The basic goal of a timing forecast circuit is to use the previous turn OFF timing to forecast the turn OFF timing in the subsequent cycles. Since the forecast circuit takes the timing information from the previous cycle, the circuit must learn the exact turn OFF timing. Thus, every time the turn OFF timing is changed, the forecast circuit takes at least one cycle to learn the new turn OFF timing. Before the forecast circuit has learned the new turn OFF timing, reverse conduction is possible. Illustrated in FIG. 8a, in the first cycle (130), the timing forecast circuit is learning the normal $V_{gs}$ cycle, and the forecasted $V_{gs}$ cycle is the same as the previous forecasted $V_{gs}$ cycle. In the second cycle, the now learned forecasted $V_{gs}$ cycle (134) is slightly shorter in duration than the normal $V_{gs}$ cycle (132) in order to prevent reverse conduction.

Figure 8B:
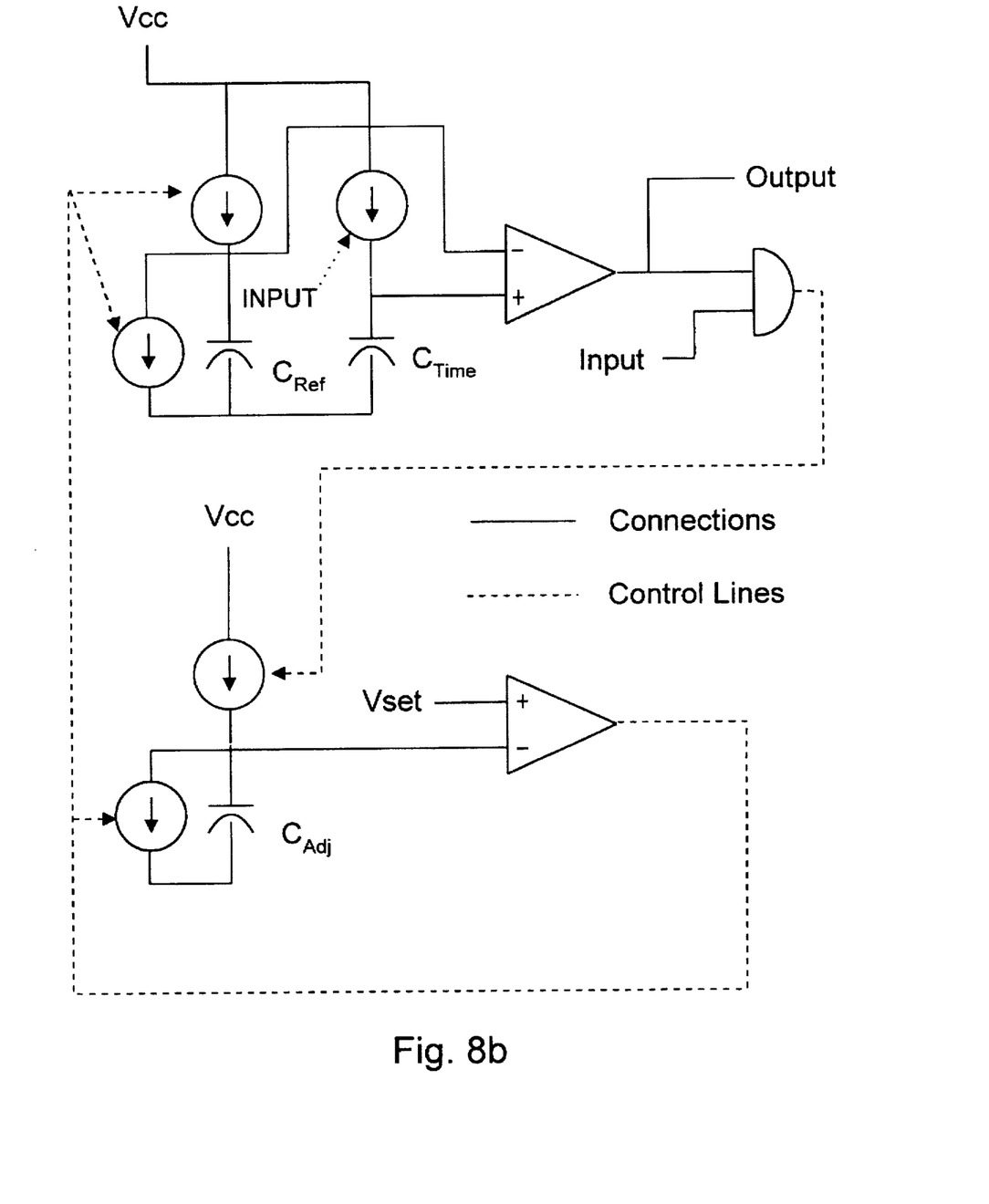
FIG. 8b sows a timing circuit that may be used in the circuit of the present invention.
Figure 8C:
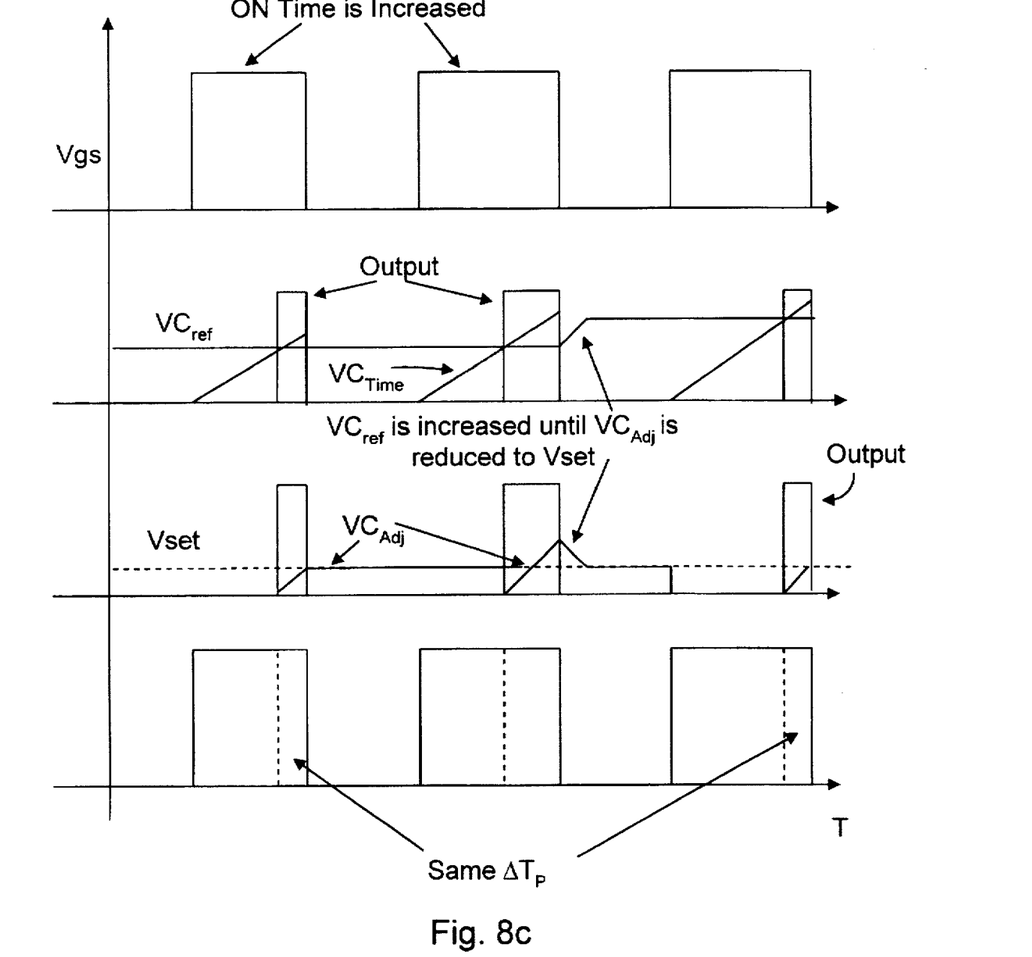
FIG. 8c illustrates the associated timing diagram for the circuit of FIG. 8b.

FIG. 8b illustrates a block diagram of a timing forecast circuit which can be used for the control circuit. $C_{time}$ is linearly charged each time $V_{gs}$ is ON, and is discharged each time $V_{gs}$ is OFF. $C_{ref}$ is used to record the ON time, and $V_{set}$ and $C_{adj}$ are used to fine tune the circuit. FIG. 8c illustrates the timing information of the timing circuit illustrated in FIG. 8b.

Figure 9:
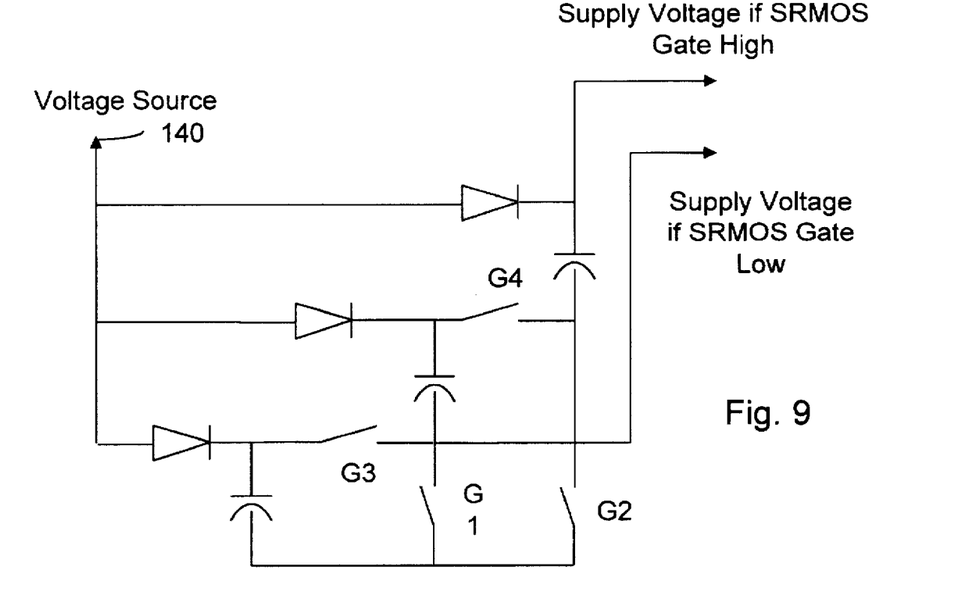
FIG. 9 illustrates a charge pump circuit to supply power to the SRMOS and the control circuit.

A charge pump circuit may be used to provide power to the control circuit and the SRMOS in low voltage applications. During the SRMOS OFF state, the SRMOS gate is discharged and there is no need for a high supply voltage. Referring to FIG. 9, a bank of individual capacitors selected to have a voltage of Vin can be individually charged from an available voltage source 140 (which may be the SRMOS drain, the output of the power converter, or transform windings, etc.) by closing gates G1 and G2 and opening gates G3 and G4. During the SRMOS ON state, to provide a high supply voltage for the SRMOS gate, the bank of individual capacitors are placed in series by closing gates G3 and G4 and opening gates G1 and G2. The number of individual capacitors determines the desired SRMOS gate voltage. Note that this charge pump circuit requires no special charge pump oscillator.

Although the present invention has been described above in terms of a specific embodiment, it is anticipated that alterations and modifications thereof will no doubt become apparent to those skilled in the art. It is therefore intended that the following claims be interpreted as covering all such alterations and modifications as fall within the true spirit and scope of the invention.

What I claim is:

1. A rectifying device having a first and a second terminal across which a voltage is to be applied, comprising:
   a transistor having a drain, a source connected to said second terminal, and a gate;
   an inductor having a precalculated amount of inductance connected between said first terminal and said drain;
   a control circuit having a first sense trace connected to said first terminal, a second sense trace connected to said second terminal, and a control trace operatively connected to said gate for applying a control voltage thereto, said control circuit being operative upon sensing a forward voltage/current characteristic between said first and second terminals to generate a first control voltage for forward biasing said transistor, said control circuit being operative upon sensing a reverse voltage/current characteristic between said first and second terminals to generate a second control voltage for reverse biasing said transistor, said inductor being operative to generate a spike voltage for detection by said control circuit when the voltage across said rectifying device is transiting between said forward and reverse voltage/current characteristics.

2. A rectifying device as recited in claim 1 further including a charge pump circuit for supplying power to said control circuit and for operating said transistor.

3. A rectifying device as recited in claim 1 wherein at least a first threshold voltage level and a second threshold voltage level between said first and second terminals are predetermined and set for said control circuit.

4. A rectifying device as recited in claim 3 wherein upon detecting said applied voltage crossing said first threshold voltage level said control circuit reverse biases said transistor from a forward biased state.

5. A rectifying device as recited in claim 4 wherein upon detecting said applied voltage crossing said second threshold voltage level, said control voltage is step-controlled to reverse bias said transistor.

6. A rectifying device as recited in claim 3 wherein upon detecting said applied voltage crossing said second threshold voltage level said control circuit forward biases said transistor from a reverse biased state.

7. A rectifying device as recited in claim 6 wherein upon sensing that the applied voltage crossing said first threshold voltage level, said control voltage is step-controlled to forward bias said transistor.

8. A rectifying device as recited in claim 1 wherein said control circuit is comprised of a plurality of comparators connected to a plurality of logic components, said logic components controlling an on-driver and an off-driver, said on-driver block charging said gate of said transistor when activated by said logic components, and said off-driver discharging said gate of said transistor when activated.

9. A rectifying device as recited in claim 1 wherein said control circuit is comprised of:

an on-driver responsive to a trigger signal in a first state of at least two possible trigger states;
an off-driver responsive to said trigger signal in a second state of said two possible trigger states;
a plurality of comparators for comparing the voltages at said first and second terminals, said applied voltage, said control voltage, and preset threshold voltages, and for generating corresponding compared signals; and
a plurality of interconnected logic components responsive to said compared signals operative to generate said trigger signal for input to said on-driver or said off-driver, wherein said trigger signal in said first state activates said on-driver for charging said gate of said transistor, and said trigger signal in said second state activates said off-driver for discharging said gate of said transistor.

10. A rectifying device as recited in claim 9 wherein a medium speed off-driver responsive to said compared signals discharges said gate voltage in a stepped fashion.

11. A rectifying device as recited in claim 9 wherein a medium speed on-driver responsive to said compared signals charges said gate voltage in a stepped fashion.

12. A rectifying device as recited in claim 9 wherein said control circuit further includes a timing forecast circuit for learning a duty cycle for forward biasing said transistor, for forecasting a learned duty cycle, and for providing an amount of time corresponding to a predetermined portion of said forecasted duty cycle for forward biasing said transistor.

13. A rectifying device as recited in claim 1 wherein said inductor is a coil.

14. A rectifying device as recited in claim 1 wherein said inductor is a calculated length of conductive trace providing a desired amount of inductance.

15. A rectifying device as recited in claim 1 wherein said forward characteristic and reverse characteristic are voltage characteristics.

16. A rectifying device as recited in claim 1 wherein said forward characteristic and reverse characteristic are current characteristics.

17. A method for operating a transistor as a rectifier having a first terminal and a second terminal, said transistor having a drain terminal connected to a first inductor terminal of an inductor, a source terminal connected to said second terminal, and a gate terminal, a voltage is to be applied across said first terminal connected to a second inductor terminal of said inductor, said rectifier oscillating between a forward biased state and a reverse biased state, comprising the steps of:
   sensing an applied voltage between said first and second terminals;
   determining said applied voltage as having a forward characteristic or a reverse characteristic;
   reverse biasing said transistor if a reverse characteristic is determined; and
   forward biasing said transistor if a forward characteristic is determined.

18. A method as recited in claim 17 wherein at least a first threshold voltage level and a second threshold voltage level between said first and second terminals are used for determining said forward characteristic and said reverse characteristic.

19. A method as recited in claim 18 wherein upon sensing said first threshold voltage level said transistor in said forward biased state is reverse biased.

20. A method as recited in claim 19 wherein upon sensing said applied voltage crosses said second threshold voltage level, said control voltage is step-controlled to reverse bias said transistor.

21. A method as recited in claim 18 wherein upon sensing said second threshold voltage level said transistor in said reverse biased state is forward biased.

22. A method as recited in claim 21 wherein upon sensing said applied voltage crossing said first threshold voltage level, said control voltage is step-controlled for forward biasing said transistor.

23. A method as recited in claim 17 wherein said inductor is a coil.

24. A method as recited in claim 17 wherein said inductor is a calculated length of conductive trace providing a desired amount of inductance.

25. A method as recited in claim 17 wherein said forward characteristic and reverse characteristic are voltage characteristics.

26. A method as recited in claim 17 wherein said forward characteristic and reverse characteristic are current characteristics.

27. A circuit for operating a transistor as a diode, said transistor having a gate, source, and drain, comprising:
- an on-driver responsive to a trigger signal in a first state of at least two possible trigger states;
- an off-driver responsive to said trigger signal in a second state of said two possible trigger states;
- a plurality of comparators for comparing the voltages at said first and second terminals, said applied voltage, said control voltage, and preset threshold voltages, and for generating corresponding compared signals; and
- a plurality of interconnected logic components responsive to said compared signals operative to generate said trigger signal for input to said on-driver or said off-driver, wherein said trigger signal in said first state activates said on-driver for charging said gate of said transistor, and said trigger signal in said second state activates said off-driver for discharging said gate of said transistor.

28. A circuit as recited in claim 27 wherein a medium speed off-driver responsive to said compared signals discharges said gate voltage in a stepped fashion.

29. A circuit as recited in claim 27 wherein a medium speed on-driver responsive to said compared signals charges said gate voltage in a stepped fashion.

30. A circuit as recited in claim 27 wherein said control circuit further includes a timing forecast circuit for learning a duty cycle for forward biasing said transistor, for forecasting a learned duty cycle, and for providing an amount of time corresponding to a predetermined portion of said learned duty cycle for forward biasing said transistor.

* * * * *